United States Patent [19]
Liberati

[11] Patent Number: 5,383,092
[45] Date of Patent: Jan. 17, 1995

[54] DEVICE FOR MOUNTING A PLURALITY OF TRANSISTORS

[75] Inventor: Daniel J. Liberati, Danbury, Conn.

[73] Assignee: Pitney Bowes Inc., Stamford, Conn.

[21] Appl. No.: 210,660

[22] Filed: Mar. 21, 1994

Related U.S. Application Data

[63] Continuation of Ser. No. 990,136, Dec. 14, 1992.

[51] Int. Cl.$^6$ ............................................. H05K 7/20
[52] U.S. Cl. .................................. 361/704; 165/80.3; 165/185; 174/16.3; 257/719; 361/710; 361/713
[58] Field of Search ..................... 165/80.3, 185; 174/16.3; 257/718–719, 726–733; 361/383–384, 386–389, 392, 395, 399; 363/141, 144–145

[56] References Cited

U.S. PATENT DOCUMENTS

| | | | |
|---|---|---|---|
| 4,288,839 | 9/1981 | Prager et al. | 361/387 |
| 4,557,225 | 12/1985 | Sagues et al. | 361/383 |
| 4,853,828 | 8/1989 | Penn | 363/141 |
| 5,134,545 | 7/1992 | Smith | 361/388 |

FOREIGN PATENT DOCUMENTS 3545253 6/1987 Germany ............................. 361/386

*Primary Examiner*—Gregory D. Thompson
*Attorney, Agent, or Firm*—Charles G. Parks, Jr.; Melvin J. Scolnick

[57] ABSTRACT

Disclosed is an arrangement for connecting a plurality of transistors to a heat sink surrounding one end of a control motor for a mailing machine. The motor is a conventional bi-directional stepping motor which controls various operational functions of the mailing machine. The direction, speed and continuity of the rotation of the motor rotor are controlled by a plurality of transistors which receive appropriate signals from a microprocessor. The transistors generate a substantial amount of heat during operation of the motor and are mounted on a heat sink connected to the motor in order to dissipate this heat. In the arrangement disclosed, there are two sets of three transistors each, and each set is mounted on the heat sink by a single screw, washer, insulator and hold-down spring, rather than by separate screws, lock washers, flat washers, insulators and nuts for each of the six transistors, thereby greatly reducing the number of parts required to assemble the transistors to the motor and the labor time required to do so.

4 Claims, 3 Drawing Sheets

DEVICE FOR MOUNTING A PLURALITY OF TRANSISTORS

This application is a continuation of application Ser. No. 07/990,136, filed on Dec. 14, 1992.

BACKGROUND OF THE INVENTION

The present invention relates generally to the field of transistor mounting devices, and more particularly to a device for mounting a plurality of transistors to a heat sink mounted which forms part of a machine control motor.

It has long been well known to utilize stepper motors, sometimes referred to as "smart" motors, to control various mechanical functions of complex machines. A principal advantage of utilizing such motors is that they can be very precisely controlled with respect to direction, speed, acceleration and deceleration, and degree of rotation of the motor rotor with respect to each intermittent movement of the rotor. Typically a machine will utilize many such motors to drive various mechanical assemblies in the machine, such as, an envelope feeder, a printer system, a tape feeder, etc. The operation of the motors is controlled from a central microprocessor which determines the sequence and mode of operation of the motors in accordance with any desired predetermined pattern to cause the mechanical functions of the machine to occur in a precise predetermined order.

Typically, the operation of each individual motor is controlled by a series of transistors which function to energize and deenergize the electrical circuitry to the banks or phases of the motor. For example, in a three phase motor there are three coils inside the rotor, and as each coil is activated by a respective transistor, which simply switch to the respective coils off and on. The rotor then turns to align the magnets of the rotor with the stator coils, thereby providing very precise positioning of the rotor and any mechanical part which is driven by the rotor. In addition, the motor is often provided with an optical encoder which monitors the operation of the motor to ensure that the rotor has turned in the direction, degree and speed as determined by the microprocessor.

In the normal course of operation, the transistors generate a considerable amount of heat and, therefore, must be mounted on a suitable heat sink associated with the motor to dissipate the heat that would otherwise cause the transistors to fail, thereby rendering the motor inoperable for its intended purpose.

Prior to the present invention, the normal procedure for mounting transistors to a heat sink was first to place a lock washer and then a flat washer onto a screw. The screw is then through an aperture in the wall of the heat sink and then through an aperture formed in the mounting tab of the transistor. An individual electrical insulator is then placed on the screw followed by a nut. The nut is then tightened on the screw to hold the transistor securely on the wall of the heat sink. This procedure required five individual parts to secure each transistor to the wall of the heat sink. Since six transistors are required to control the operation of a three phase motor, 30 individual parts are required to secure the six transistors to the heat sink for each motor in the machine, of which there are several. Thus, it is apparent that with a machine having ten motors, as many machines do, 300 individual parts are required just to mount the motor controlling transistors to the heat sinks.

In addition to the number of parts required and the cost thereof, a considerable amount of time is expended in the labor required to assemble these parts. For each transistor, an assembly person must handle and assemble five parts, not including the transistor and a heat transfer pad which is inserted between the transistor and the wall of the heat sink. Again, for each motor, the assembly person must handle and assemble 30 parts, or 300 for a machine having 10 motors. The amount of time required for all of this assembly work is a significant contribution of the overall cost of the manufacture of the machine.

BRIEF SUMMARY OF THE INVENTION

The present invention seeks to at least obviate, if not eliminate, the disadvantages of the prior procedure for connecting transistors to the heat sink of a stepping motor.

In its broadest aspects, the present invention provides a device for connecting a plurality of transistors to a flat surface of a supporting member, each transistor having a flat mounting tab provided with an opening. The supporting member has a flat surface with an aperture therethrough on which the transistors are mounted, and each transistor have a flat mounting tab adapted to abut the flat surface of the supporting member.

The transistors are mounted in groups, and at least one transistor of each group has an aperture through the mounting tab thereof. Finally, there is a connecting means interconnected between the supporting member and the mounting tab of the transistor having the aperture in the mounting tab and the other transistors in the group for connecting all of the transistors to the supporting member.

In some of the more limited aspects of the invention, the connecting means comprises an elongate member, such as, a screw, which extends through the aperture in the supporting member and through the aperture in the mounting tab of the transistor having the apertured mounting tab, and a connecting member connected to the free end of the elongate member for securing the mounting tab of the transistor having the apertured mounting tab to the supporting member. The connecting member has extended portions for engaging the mounting tabs of the other transistors in the group for securing the mounting tabs of the other transistors to the supporting member, with the result that a single elongate member and connecting member function to connect all of the transistors to the supporting member.

In a presently preferred embodiment of the invention, the transistors are placed in groups of three in side-by-side relationship, each group being on one inside wall of a rectangular heat sink attached to one end of the motor. The transistor with the aperture in the mounting tab is located between two other transistors, and the screw passes through the transistor with the apertured mounting tab. The connecting member is an elongate piece of spring steel having a central aperture to receive the free end of the screw which is threadedly engaged with the aperture in the connecting member. The connecting member also has laterally extending portions which are bent inwardly toward the mounting tabs of the transistors so as to exert a retaining pressure against these mounting tabs when the connecting member is engaged with the screw and is tightened against the mounting tab of the middle transistor.

With this arrangement, each group of three transistors requires only one screw, one washer, a single insulating member and a single connecting member, for a total of four parts for the group of transistors. Thus, considering again the three phase motor mentioned above which requires six transistors for operation, the total number of parts required to mount the transistors on the heat sink is 8, rather than the 30 required for the prior mounting procedure. Thus, it is apparent that the cost in both parts and labor to assemble the transistors utilizing the arrangement of the present invention is less than one third of the cost of the prior procedure. Another advantage of the mounting procedure of the present invention is that greatly reduces the likelihood that the mounting elements for the transistors can become loose, thereby reducing the effectiveness of heat transfer between the transistors and the heat sink.

Having briefly described the general nature of the present invention, it is a principle object thereof to provide a device for connecting a plurality of transistors to a supporting member which is far more cost effective than prior techniques for mounting transistors and which avoids other disadvantages of the prior techniques.

It is another object of the present invention to provide a device for connecting a plurality of transistors to a supporting member which greatly reduces the number of parts involved and the amount of labor required to assemble the parts.

These and other objects and advantages of the present invention will become more apparent from an understanding of the following detailed description of a presently preferred form of the invention.

DETAILED DESCRIPTION OF THE INVENTION

Figure 1:
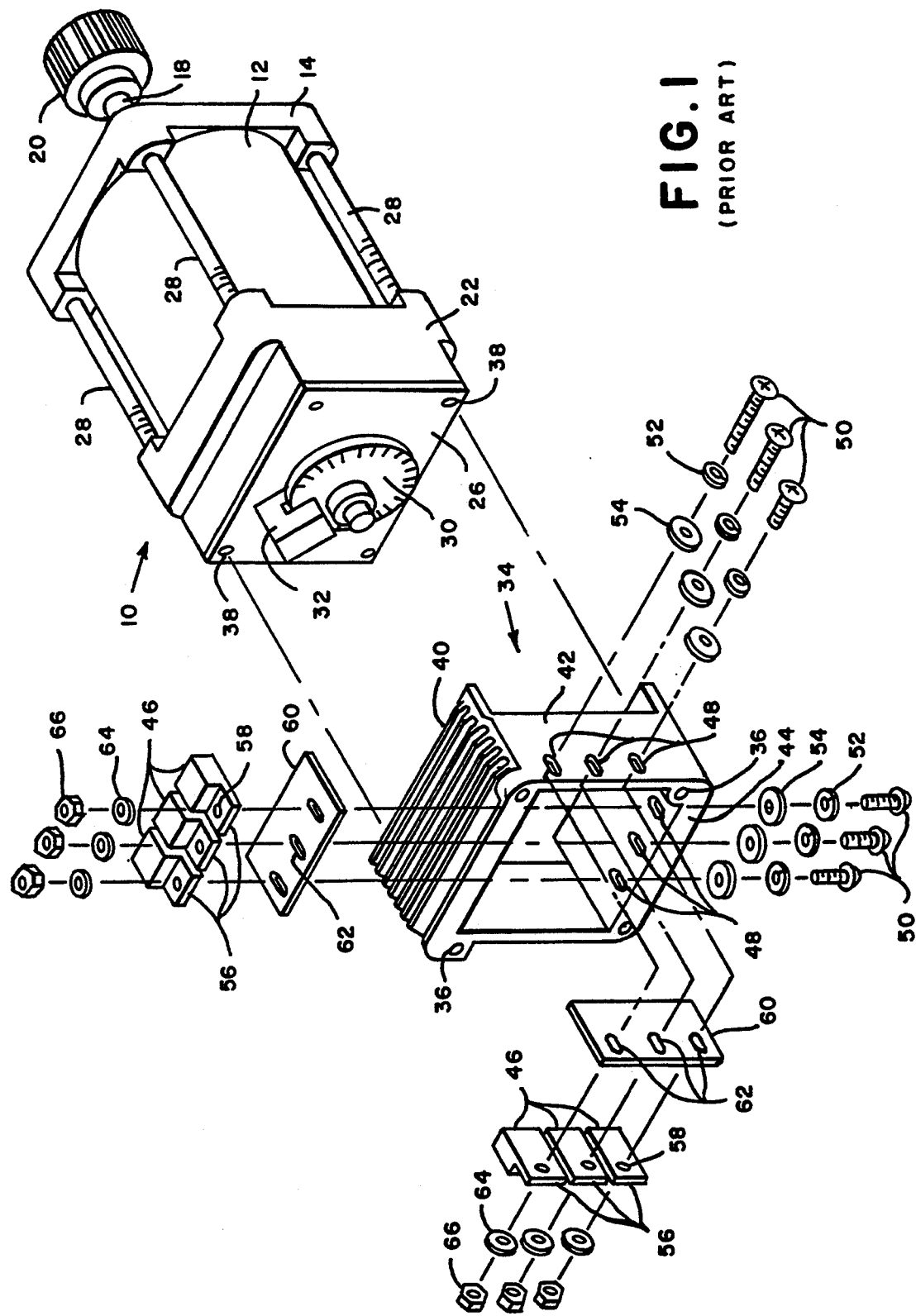
FIG. 1 is an exploded perspective view of a drive motor showing a heat sink which is normally attached to the end of the motor, and the prior art method of connecting a plurality of transistors to the inside walls of the heat sink.
Figure 3:
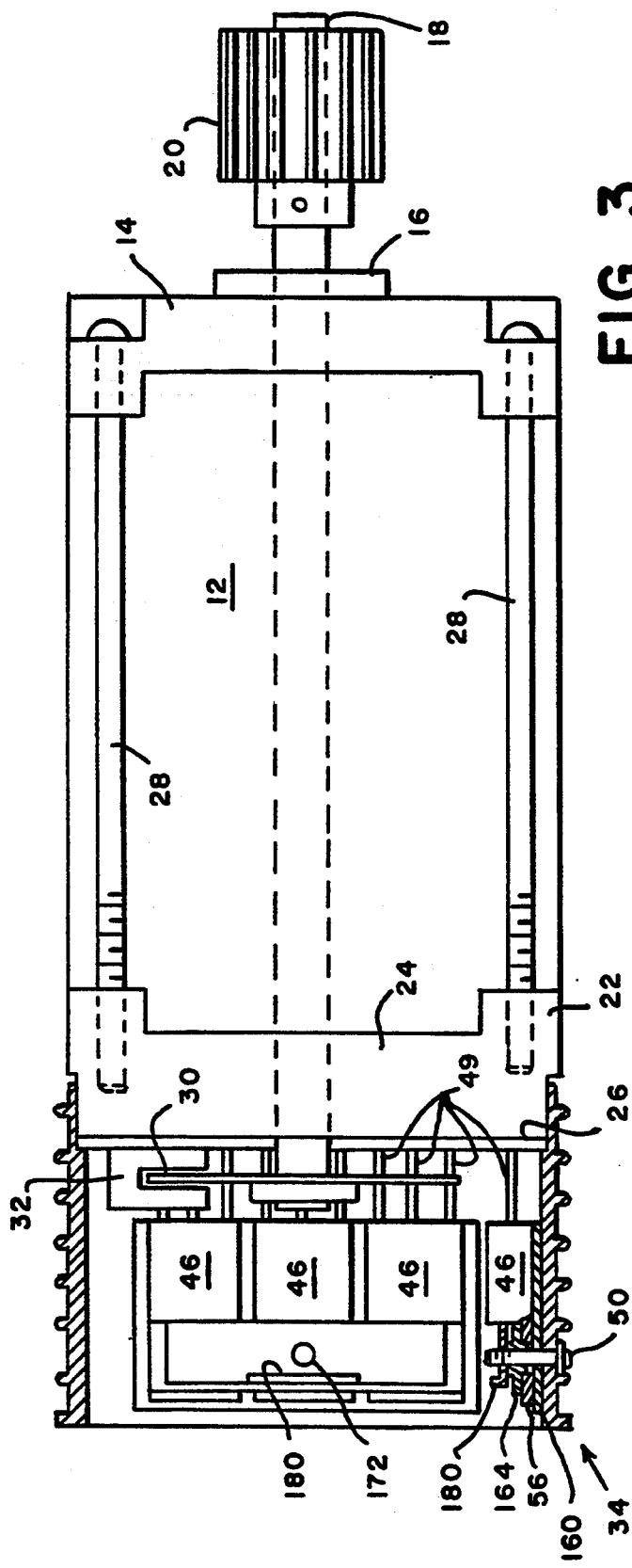
FIG. 3 is a side view of the motor and heat sink, with a portion of the heat sink walls broken away to show the transistors therewithin mounted in accordance with the present invention.

Referring now to the drawings, and particularly to FIGS. 1 and 3 thereof, a stepping motor, designated generally by the numeral 10, comprises a main body 12 which encloses the field coils of the motor as well as the rotor (not shown). An end frame 14 is located on one end of the motor body 12 and includes a suitable bearing 16 (see FIG. 3) for a shaft 18 formed on the end of the rotor and which supports a suitable drive gear 20. Another end frame 22 is located on the other end of the motor body 12 and includes a bearing 24 for the other end of the rotor shaft 18, and also includes a printed circuit board 26 on which various electronic components (not shown) are mounted to which the transistors yet to be described are connected for controlling operation of the motor 10. The end frames 14 and 22 are held together on the motor body 12 by screws 18 which extend between the frames. The slotted disc 30 of an optical encoder is mounted on the end of the rotor shaft 18 that protrudes from the end frame 22. The sensor 32 of the optical encoder is mounted on the printed circuit board 26 in position to read the slots of the disc 30 as the latter rotates with the rotor shaft.

A substantially rectangular heat sink generally designated by the numeral 34 is affixed to the outer end of the end frame 22 by means of screws (not shown) which pass through openings 36 in the heat sink 34 and screws into apertures 38 in the end frame 22. The heat sink 34 includes fins 40 formed on opposite sides of the heat sink to dissipate the heat generated by the transistors, yet to be described, during normal operation of the motor.

Referring now only to FIG. 1, the traditional manner of connecting the transistors to the heat sink is illustrated for the purpose of visual contrast with that of the present invention. In the particular situation disclosed, the motor 10 is a three phrase motor, requiring six transistors to control the electrical switching of the three banks of rotor coils. Thus, as seen in FIG. 1, six transistors 46 are arranged in two groups of three transistors each, with one group being secured to the inner surfaces of the walls 42 and 44 adjacent the apertures 48 formed in these walls of the heat sink 34. The transistors are connected to the printed circuit board by contact strips 49 (see FIG. 3), of which there are three such contact strips for each transistor. For convenience of assembly, the contact strip have sufficient strength to hold the transistors in place adjacent one another before they are secured to the walls 42 and 44 of the heat sink. Each transistor is secured to the inner surfaces of the walls 42 and 44 by means of screws 50, on which lock washers 52 and flat washers 54 have been placed before the screws 48 are inserted through the apertures 48 in the walls 42 and 44.

Each transistor 48 is provided with a mounting tab 56 having an aperture 58 through which the screw passes. A pair of thermal pads 60 formed of a material having a nigh heat conductivity characteristic are provided for each group of transistors. The thermal pads 60 is positioned between the transistors 48 and the walls 42 and 44 of the heat sink 34 to assure good heat transfer from the transistors to the heat sink. The thermal pads 60 are each provided with three apertures 62 through which the screws 50 pass. A high temperature resistant electrical insulator 64 is provided on each screw 50 to insulate the screw from the transistor 48. Finally, the transistors are secured by nuts 66 placed on each screw 50.

It is immediately apparent from the foregoing description that the prior method of attaching transistors to the heat sink requires a large number of parts and considerable time to perform the assembly procedure. Specifically, each transistor requires five parts, a screw 50, lock washer 52, flat washer 54, insulator 64 and nut 66 to secure it to the heat sink. Thus, for the six transistors, a total of 30 parts is required for each motor. And since it is not uncommon for a typical product, such as a mailing machine in which the motor disclosed herein is used, to employ at least 10 such motors, for a total of 300 parts to install the 60 transistors required. Thus, the total number of parts required for each product becomes a significant contribution to the cost of manufacture of the product.

In addition to the cost of the parts, the cost of assembly is also a factor contributing significantly to the manufacturing cost of the product. All of the screws, washers, insulators and nuts described above must be assembled by hand, and the individual nuts must be held with a wrench to prevent them from turning while the screws are being tightened with a screwdriver. In addition, when the transistors are connected to the printed circuit board by the contact strips 49, the spacing of the transistors must precisely correspond to the spacing of the apertures in the heat sink walls so that all the parts will align properly during assembly.

Figure 2:
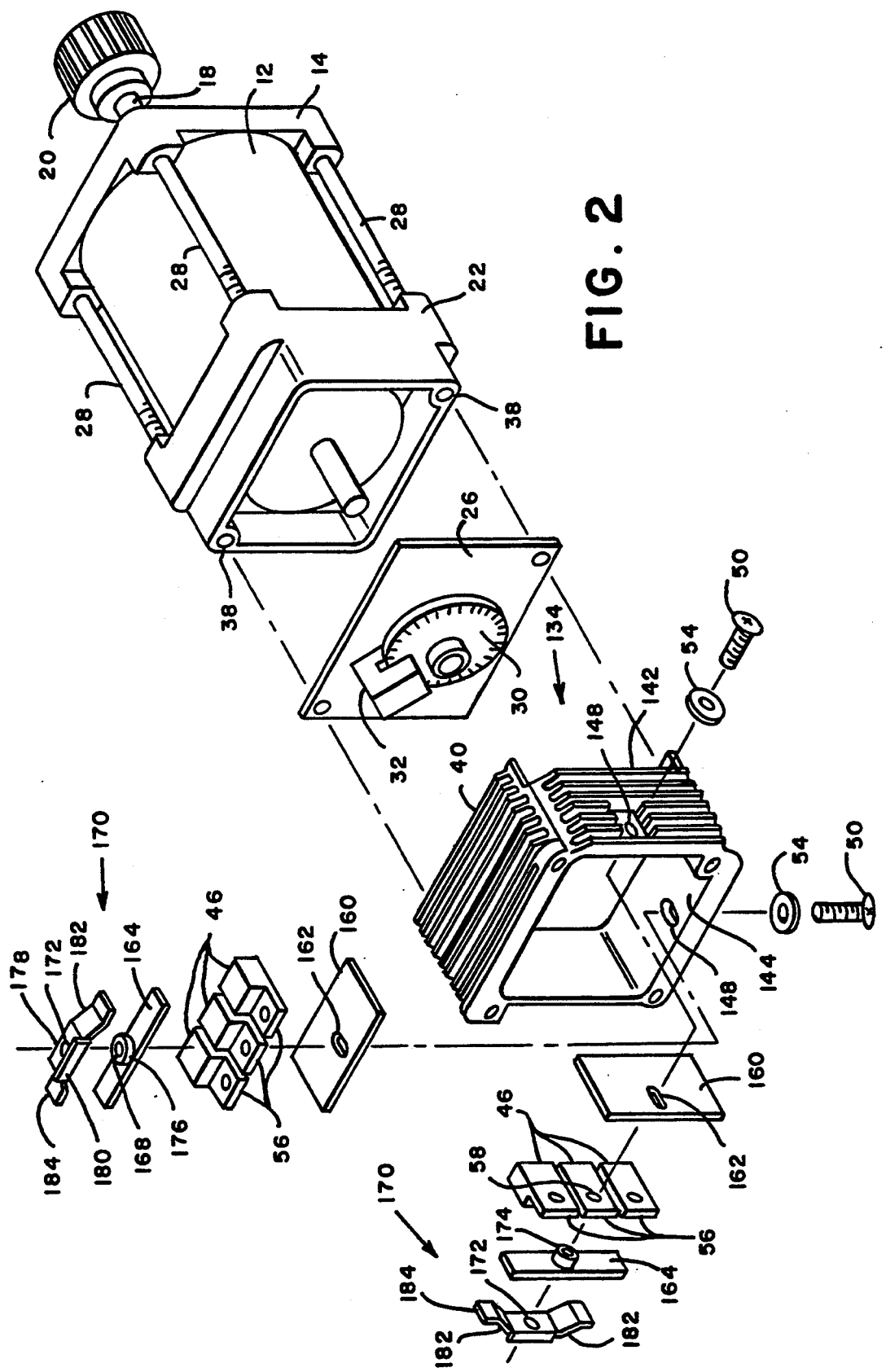
FIG. 2 is a view similar to FIG. 1, but showing the arrangement of the present invention for connecting the transistors to the inside walls of the heat sink.
Figure 4:
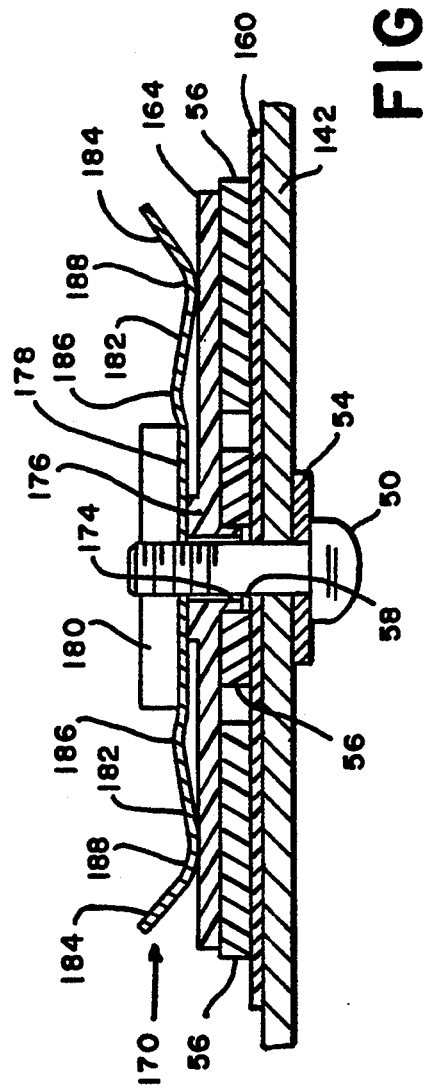
FIG. 4 is a sectional view, drawn to an enlarged scale, of one side wall of the heat sink showing the transistors mounted thereon in accordance with the present invention.

Referring now to FIGS. 2, 3 and 4, corresponding parts shown in these figures and in FIG. 1 have been given the same reference numerals and therefore are not described again except where necessary for an understanding of the invention. As best seen in FIG. 2, each group of three transistors 46 is secured to the side walls 142 and 144 of the heat sink generally designated 134, by a single connecting means which is interconnected between the heat sink and the mounting tab 56 of the center transistor 46 and the other two transistors. More specifically, the connecting means comprises a single screw 50 having a flat washer 54 thereon, which is passed through the apertures 148, of which only one such aperture is required in each of the walls 142 and 144 of the heat sink 134. The screw 50 then passes through a single aperture 162 in the thermal transfer pad 160, then through the aperture 58 of the center transistor 46. As was mentioned earlier, the three transistors 46 are held in position adjacent one another prior to being secured to the walls of the heat sink since they have been connected to the printed circuit board 26 by the contact strips 49.

A high temperature electrical insulator strip 164 having a central aperture 168 is placed over the screw 50. A multi-transistor hold down clip, generally designated by the numeral 170, which is formed of a high strength spring steel, is threadedly engaged with the screw 50, the clip 170 having a central aperture 172, the periphery of which has been formed so as to engage with the threads on the screw 50. As best seen in FIGS. 2 and 4, the insulator strip 164 has a relatively narrow peripheral boss 174 surrounding the aperture 168 formed on the side of the insulator strip 164 which faces the mounting tab 56 of the center transistor 46. This boss 174 projects into the aperture 58 in the mounting tap 56 of the transistor of the center transistor and electrically insulates it from the screw 50. The insulator strip 164 has a relatively wide peripheral boss 176 surrounding the aperture 168 formed on the opposite side of the insulator strip. This boss forms a seat for the clip 170 which secures the entire transistor assembly together in the manner now to be described.

The clip 170 has an elongate, central flat portion 178 which includes the aperture 172, and also includes an upstanding flange 180 extending along the length of the flat portion 178 to add strength and rigidity to the flat portion 178 to prevent it from bending when placed under stress as described below. At each end of the flat portion 178 is a laterally extending portion adapted to engage the mounting tabs of the other transistors to press them against the walls 142 and 144 of the heat sink 134 to forcibly retain them in place. In the disclosed embodiment, the laterally extending portion comprises a relatively short transition portion 182 connected to the central flat portion 178 and which is bent inwardly toward the insulator strip 164, and at the outer end of each transition portion 182 is another relatively short outer flat portion 184, both of which lie in a plane sightly spaced from but parallel to the plane of the central flat portion 178. As best seen in FIG. 4, the junctures between the central flat portion 178 and the transition portions 182 are indicated as 186, and the junctures between the transition portions 182 and the outer flat portions 184 are indicated as 188.

From the foregoing description, it will be seen that when the parts are assembled as shown in FIG. 4, the multi-transistor hold own clip 170 functions both as a nut for threaded engagement with the screw 50 to securely attach the center transistor 46 to the side wall 142 of the heat sink 134, and as a spring hold down clip for firmly pressing the adjacent transistors against the side wall, thereby reducing the required hardware and accompanying assembly labor by two thirds over the prior method of assembly. When the clip 170 is placed over the screw 50 and threadedly engaged therewith, the central flat portion 178 begins to move toward the outer surface of the boss 176. At the same time, the junctures 188 between the outer flat portions 184 and the transition portions 182 contact the mounting tabs 64 of the outer transistors 46 and begin to press these transistors against the thermal pad 160 and the wall 142. As the screw 50 is turned in the aperture 172 of the clip 170, the central flat portion 178 continues to move toward the outer surface of the boss 176 until it abuts the surface of the boss, whereupon the screw 50 is turned as tightly as possible in the aperture 172 and the central transistor is firmly secured in place.

During this latter movement of the central flat portion 178 of the clip 170, the transition portions 182 have been deflected slightly inwardly toward the insulator strip 164, which tends to bend the outer flat portions 184 slightly outwardly from the insulating strip 164. Due to the nature of the spring steel from which the clip 170 is formed, the deflection of the transition portions 182 from their normal configuration shown in FIG. 3 to the flattened configuration shown in FIG. 4 creates a very substantial biasing force on the junctures 188 which are pressing on the outer portions of the insulator strip 164 direction over the mounting tabs 56 of the outer transistors 46. As shown in FIG. 4, the flange 180 extending across the central flat portion 178 of the clip 170 prevents the flat portion 178 from bending, thereby concentrating of the deflection of the clip 170 between the junctures 186 and 188 of the transition portions 182.

The parts are constructed and arranged so that the spring force of the clip 170 on the two outer transistors is sufficiently high to allow proper heat transfer to occur between these transistors and the heat sink. Also, the clamping force of the screw 50 and the central flat portion 178 of the clip 170 is sufficiently high to overcome the spring force exerted on the junctures 188 and to hold the outer transistors against the wall 142 with sufficient force to allow proper heat transfer to occur between these transistors and the wall 142. It will be apparent that the same structural arrangement and resulting function occur on the wall 144 of the heat sink 134.

In addition to the obvious reduction in the number of parts and assembly labor time provided by the present invention, it is inherent that the self-fixturing nature of the clip 170 causes it to bear against the insulator strip 164 and prevents it from turning during tightening of the screw 50, thereby eliminating the necessity for holding it with a wrench or other tool, as was necessary with the prior assembly method. Also, the need to precisely control alignment between the holes 58 in the transistors 46 and the heat sink 34 is greatly reduced since no screws are used to attach the two end transistors, thereby further reducing the labor required to assemble the parts.

What is claimed is:

1. A device for connecting a plurality of transistors (46) to a flat surface (144) of a supporting member (134) in side-by-side relationship on said flat surface, said flat surface of said supporting member having an aperture (148), each of the transistors having a flat mounting tab (56), the plurality of transistors having a first transistor and a plurality of second transistors, the first transistor having an aperture (58) in the mounting tab, the first transistor located central relative to the second transistors and the aperture in the first transistor in axial alignment with said aperture in said supporting member, said device comprising:

a screw (50) having a free end, a single connecting means (170) for connecting the plurality of transistors to said supporting member, said single connecting means having:

a central flat portion (178) having an aperture (172) adapted to receive said free end of said screw in threaded engagement therewith, opposed laterally extending transition portions (182) connected to said central flat portion, said transition portions are bent inward slightly toward said flat surface of said supporting member, and opposed laterally extending outer flat portions (184) connected to said transition portions, respectively, said outer flat portions being positioned to bias the mounting tabs of the plurality of second transistors toward said supporting member, said free end of said screw passing through said aperture in said supporting member and adapted to pass through the aperture in the first transistor and in threaded engagement with said single connecting means, whereby said single connecting means functions as a nut for retaining said first transistor and as a spring hold down clip for retaining said plurality of second transistors.

2. The device in claim 1, further comprising:

a thermo pad (160) positioned between said flat surface of said support member and the to be connected transistors.

3. The device in claim 1, further comprising:

an insulator strip (164) positioned between said connecting means and the tabs of the to be connected transistors.

4. The device in claim 3, further comprising:

a thermo pad positioned between said flat surface of said supporting member and the to be connected transistors.

* * * * *